(12) United States Patent  
Millar et al.

(10) Patent No.: US 7,889,580 B2  
(45) Date of Patent: Feb. 15, 2011

(54) MEMORY SYSTEM HAVING INCORRUPTED STROBE SIGNALS

(75) Inventors: Bruce Millar, Stittsville (CA); Robert McKenzie, Ottawa (CA)

(73) Assignee: MOSAID Technologies Incorporated, Ottawa (CA)

( * ) Notice: Subject to any disclaimer, the term of this patent is extended or adjusted under 35 U.S.C. 154(b) by 0 days.

(21) Appl. No.: 12/651,707

(22) Filed: Jan. 4, 2010

(65) Prior Publication Data

US 2010/0097869 A1 Apr. 22, 2010

Related U.S. Application Data

(62) Division of application No. 11/780,231, filed on Jul. 19, 2007, now Pat. No. 7,652,932.

(51) Int. Cl.  
*G11C 7/00* (2006.01)

(52) U.S. Cl. .................................. 365/193; 365/233.5

(58) Field of Classification Search ................ 365/193, 365/233.5  
See application file for complete search history.

(56) References Cited

U.S. PATENT DOCUMENTS

| | | | |
|---|---|---|---|
| 6,754,133 B2 * | 6/2004 | Morita et al. | 365/233.18 |
| 6,768,698 B2 | 7/2004 | Kono | |
| 6,842,396 B2 * | 1/2005 | Kono | 365/193 |
| 6,889,336 B2 | 5/2005 | Schoenfeld et al. | |
| 7,143,258 B2 | 11/2006 | Bae | |
| 2002/0018396 A1 * | 2/2002 | Morita et al. | 365/233 |
| 2003/0185088 A1 | 10/2003 | Kono | |
| 2003/0200407 A1 | 10/2003 | Osaka et al. | |
| 2005/0138277 A1 | 6/2005 | Koo | |
| 2005/0206542 A1 | 9/2005 | Yanagisawa | |
| 2008/0031079 A1 | 2/2008 | Osawa et al. | |

FOREIGN PATENT DOCUMENTS

| | | |
|---|---|---|
| CA | 2248731 | 3/1999 |
| JP | 06046051 | 2/1994 |
| JP | 2005056996 | 1/2005 |

OTHER PUBLICATIONS

Van Roon, "555 Timer Tutorial", http://www.uoguelph.ca/~antoon/gadgets/555/555.html, printed on Nov. 10, 2006.  
Sedra et al., "Microelectronic Circuits", 3rd Ed., Oxford University Press, 1991, pp. 875-800.  
PCT Patent Application No. PCT/CA2008/001252 International Search Report dated Oct. 23, 2008.

* cited by examiner

*Primary Examiner*—Tuan T. Nguyen  
(74) *Attorney, Agent, or Firm*—Daniel Hammond

(57) ABSTRACT

A memory system circuit and method therefor are disclosed. The circuit is adapted to detect a transition in a data timing signal from an indeterminate logic level to a selected one of a high logic level and a low logic level. The circuit includes a comparator having a first input, a second input and an output. The first and second inputs receive the data timing signal and a reference voltage respectively. The output changes logic levels in response to a change in polarity of a voltage difference between the voltage of the timing signal and the reference voltage. The reference voltage is sufficiently closer to the selected one of the logic levels as compared to the other of the logic levels so as to at least substantially prevent potential false positive detections.

7 Claims, 6 Drawing Sheets

MEMORY SYSTEM HAVING INCORRUPTED STROBE SIGNALS

CROSS REFERENCE TO RELATED APPLICATIONS

This application is a divisional of U.S. patent application Ser. No. 11/780,231 filed on Jul. 19, 2007 which is incorporated herein by reference in its entirety.

BACKGROUND OF THE DISCLOSURE

Microelectronics circuits include a variety of different circuit components, and one type of circuit component that is often found in these circuits is a comparator. The comparator is a circuit element with two inputs labeled positive and negative and one output. The output goes either high or low depending upon which input is greater.

As will be appreciated by those skilled in the art, the signals being received by comparators are often noisy. When the input voltage of the received signal is close to the threshold voltage of the comparator, one potential problem is that a small amount of noise can make the voltage at the input rapidly fluctuate to values just above or just below the threshold voltage for the comparator. This can cause output "glitches" that may cause instability in the larger circuit, perhaps a control circuit, for example, that is impacted by the output of the comparator.

Existing solutions outside of the field of memory systems include solutions that employ a Schmidt Trigger. In this regard, one skilled in the art will appreciate that a Schmidt Trigger makes use of feedback, so that the current output state essentially "reinforces" the input value. For instance, if the output state is currently logic "high" (logic '1') there will not be an output transition to logic "low" (logic '0') unless the input voltage drops substantially below a low threshold voltage. Conversely, if the output state is currently logic '0', there will not be an output transition to logic '1' unless the input voltage rises substantially above a high threshold voltage. The difference in the two threshold voltages can be referred to as the hysteresis voltage.

A problem with Schmidt Triggers is that they are not designed to work in memory systems, and therefore the principles of hysteresis have apparently not previously been applied in the context of providing incorrupted strobe signals within a memory system.

SUMMARY

It is an object of the invention to provide an improved memory system.

According to one aspect of the invention, there is provided a method for preamble detection within a microelectronics system. The method includes the step of receiving a clock signal of the type in which a series of regular pulses in voltage level of the clock signal are preceded by a preamble period having a beginning and an end. A transition in the clock signal from an indeterminate logic level to a selected one of a high logic level and a low logic level occurs at the beginning of the preamble period. The method also includes the step of receiving a complement of the clock signal. A transition in the complement of the clock signal from the indeterminate logic level to the other of the logic levels occurs at the beginning of the preamble period. The method also includes the step of generating indication that the beginning of the preamble period has occurred by: i) detecting the transition in the clock signal based on when the voltage level of the clock signal crosses through a first threshold of a voltage range; and ii) detecting the transition in the complement of the clock signal based on when the voltage level of the complement of the clock signal crosses through a second threshold of the voltage range.

According to another aspect of the invention, there is provided an indication circuit in a memory system within which a clock signal and a complement of the clock signal are generated. The clock signal is of the type in which a series of regular pulses in voltage level of the clock signal are preceded by a preamble period having a beginning and an end. A transition in the clock signal from an indeterminate logic level to a selected one of a high logic level and a low logic level occurs at the beginning of the preamble period. A transition in the complement of the clock signal from the indeterminate logic level to the other of the logic levels occurs at the beginning of the preamble period. The circuit includes a first comparator having first and second inputs. The first comparator is adapted to detect, when the clock signal and a first reference voltage are received at the first and second inputs of the first comparator respectively, a change in polarity of a voltage difference between the voltage of the clock signal and the first reference voltage. A second comparator has first and second inputs. The second comparator is adapted to detect, when the complement of the clock signal and a second reference voltage are received at the first and second inputs of the second comparator respectively, a change in polarity of a voltage difference between the voltage of the complement of the clock signal and the second reference voltage. The circuit also includes logic circuitry for generating indication, by way of an output signal of the logic circuitry transitioning to an active logic level, that the beginning of the preamble period has occurred. The indication is generated when the transitions in the clock signals are detected.

According to yet another aspect of the invention, there is provided a memory controller circuit for detecting a transition in a data timing signal from an indeterminate logic level to a selected one of a high logic level and a low logic level. The circuit includes a comparator having a first input, a second input and an output. The first and second inputs receive the data timing signal and a reference voltage respectively. A signal from the output changes logic levels in response to a change in polarity of a voltage difference between the voltage of the data timing signal and the reference voltage. The reference voltage is sufficiently close to the one of the logic levels, whereby at least substantial prevention of potential false positive detections is achieved.

Thus, improved signal transition detection circuits for memory systems have been provided.

BRIEF DESCRIPTION OF THE DRAWINGS

Reference will now be made, by way of example, to the accompanying drawings.

Similar or the same reference numerals may have been used in different figures to denote similar components.

DETAILED DESCRIPTION OF EXAMPLE EMBODIMENTS

Figure 1:
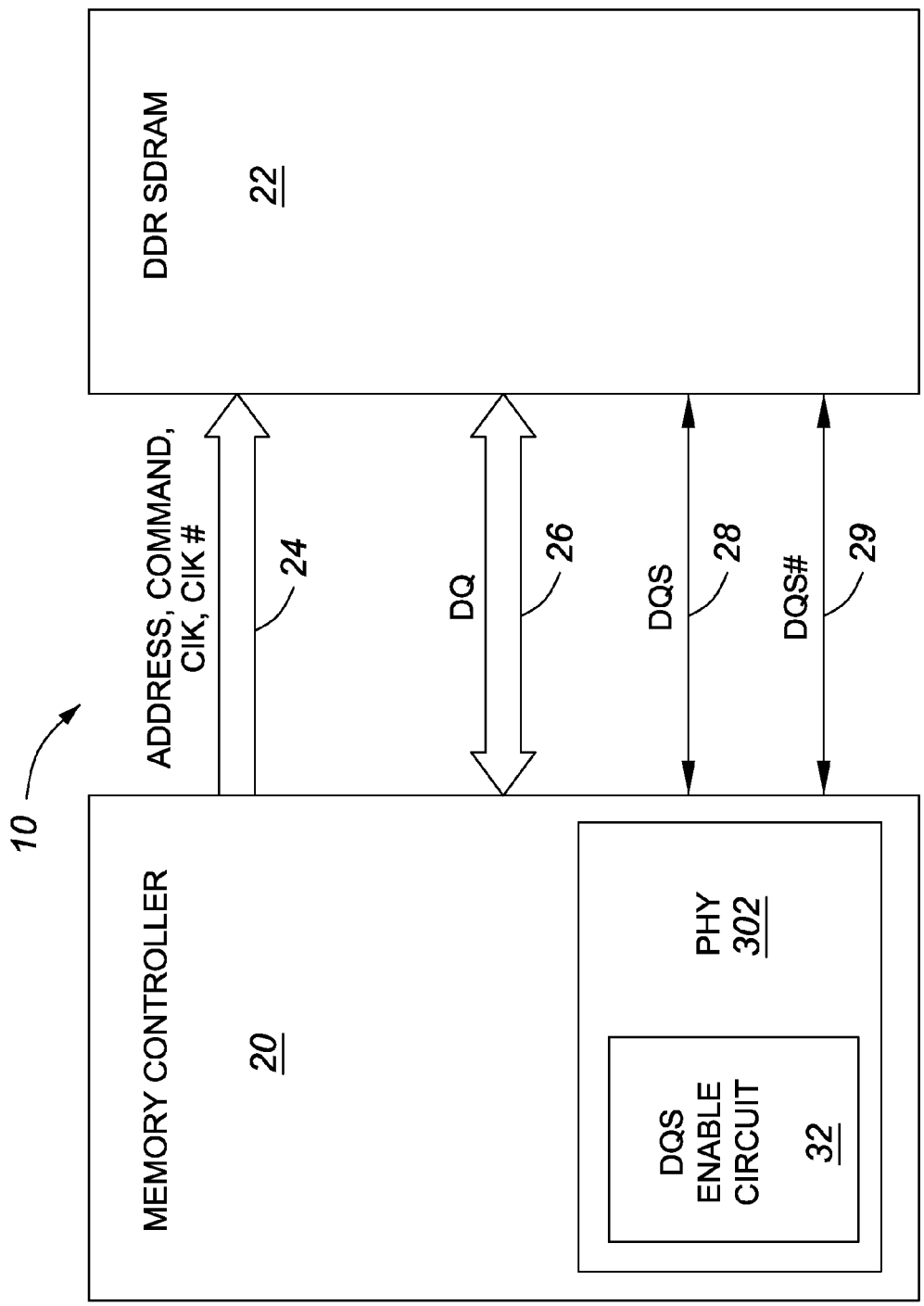
FIG. 1 is a block diagram of a synchronous dynamic random access memory device that includes a data strobe clock (DQS) enable circuit in accordance with an example embodiment.

Referring now to the drawings, FIG. 1 is a block diagram of a Synchronous Dynamic Random Access Memory (SDRAM) device 10 that includes a memory controller 20 and a Double Data Rate Synchronous Dynamic Random Access Memory (DDR SDRAM) 22. In terms of the DDR SDRAM 22, those skilled in the art will appreciate that a characteristic of it is operation at twice the speed relative to the clock, because the latching or accessing of data occurs at both rising and falling edges of DQS. The illustrated DDR SDRAM 22 is connected to the memory controller 20 through connections including: a unidirectional bus 24 used to send addresses, commands and clocks from the memory controller 20 to the DDR SDRAM 22; a bi-directional bus 26 for writing data (DQ) to the DDR SDRAM 22 and reading DQ from the memory; and bi-directional connections 28 and 29 for carrying data strobe clock (DQS) and the complement of DQS respectively.

As will be appreciated by those skilled in the art, DQS is a special clock signal, which is, in turn, a type of data timing signal. Also, DQS is employed in read and write operations. Partly in keeping with a typical clock signal, DQS is a sequence of electronic pulses for a portion of a read or write operation; however at other times when a read or write operation is not occurring, DQS is in high-impedance and at an indeterminate logic level (in between logic '1' and logic '0'). In a write operation, DQS is generated synchronously with the write data by the memory controller 20, and also DQ for the write operation will be inputted, in some examples, to a suitable buffer in anticipation of being stored in a manner understood by those skilled in the art, in particular, in a data latch with the rising and falling edges of DQS. In a read operation, DQS and read data from the DDR SDRAM 22 are generated synchronously by the memory and, as will be appreciated by those skilled in the art, DQ for the read operation will, in some examples, be inputted to a suitable buffer in anticipation of being stored in a data latch with the rising and falling edges of DQS.

Before continuing with the present description of the SDRAM device 10, it should be noted that the memory controller 20 and the DDR SDRAM 22 comprise many individual circuits and components for carrying out their respective functions. Because one skilled in the art need not have an understanding of how to design or modify all components of the memory controller 20 and the DDR SDRAM 22 in order to obtain the benefits of the teachings disclosed herein, it will be understood that only relevant circuits and components are shown and described in detail.

With reference now to the memory controller 20 of FIG. 1, this will, in some examples, be an Application-Specific Integrated Circuit (ASIC). The memory controller 20 operates a main clock. Also, the memory controller 20 has, within a PHY (Physical Interface) 302, a DQS enable circuit 32 that generates a gated DQS from the incoming DQS signal 28. The DQS enable circuit 32 will be further described later in connection with the description for a more detailed diagram.

Figure 2:
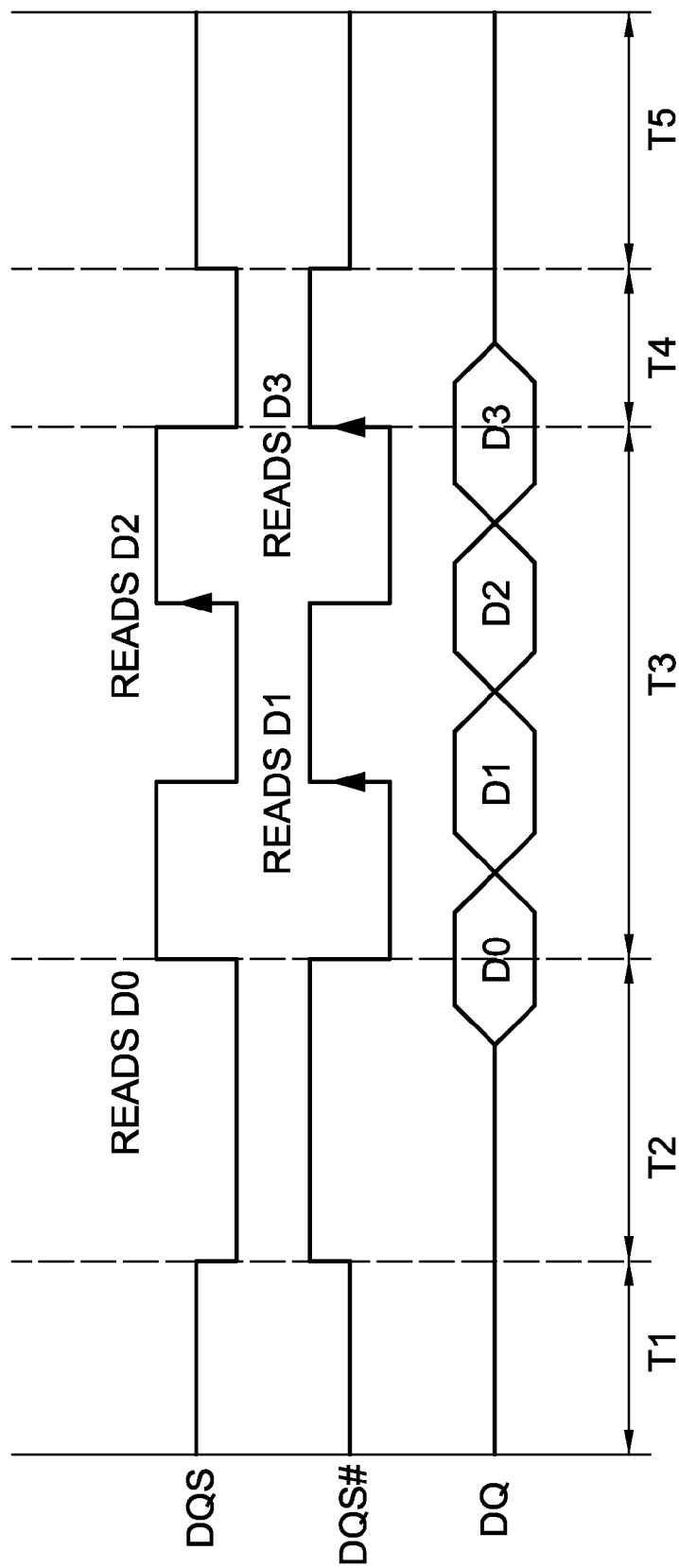
FIG. 2 is a timing diagram illustrating a DQS over a number of time periods.

Reference will now be made to FIG. 2. FIG. 2 illustrates signals transitions for DQS when DQ is being captured in response to transmission of data from the DDR SDRAM 22. In addition to DQS, illustrated complement of DQS (DQS#) conveniently allows rising edges to be provided to rising-edge triggered circuitry at instance in time when falling edges of DQS occur. Also, in some alternative examples, other DQS-related signals (having waveforms differing from the illustrated waveforms) could be generated in connection with a read command. For example, signals similar to illustrated DQS and DQS#, but with duty cycles significantly less than 50%, could be generated. Also, it will be understood that the term "complement" as it is used herein refers to a practical but not mathematical complement. For example, DQS and DQS# are normally shifted apart some number of degrees off of the theoretical amount of 180°.

For the purposes of the present discussion, it is fitting to divide the activity in the DQS waveform into five periods of time. During a first period of time, T1, DQS is in high-impedance. The next period is the preamble period labeled in FIG. 2 as T2. This is typically a short setup period such as, for example, slightly less than one clock cycle, so as to permit DQ to be properly read. After T2 is a period T3, during which time DQ is read on edges of DQS (both rising and falling in the illustrated example). Ideally each of these edges will be aligned as close as possible to a center of one of the data eyes of the data D0, D1, D2 and D3. As will be appreciated by those skilled in the art, a Delay Locked Loop (DLL) can be used to produce the phase shift of 90° of DQS so that its edges will be properly aligned.

After T3 is the postamble period labeled in FIG. 2 as T4. Like T2, T4 is typically a short period (for example, slightly less than half a clock cycle) in order to provide for proper termination of the read operation. At the end of T4 there is a transition to a last illustrated period T5, and at this time DQS returns to the state it was in during T1 (i.e. high-impedance).

Thus, for periods of time before and after a read operation, DQS will be in high-impedance. As mentioned, the voltage assigned to the state corresponding to high-impedance is roughly mid-level between logic '1' and logic '0'; however in actual implementations the voltage of DQS (and the signal output of, for example, any comparator with mid-level voltage threshold that buffers DQS) will fluctuate significant above and below the aforementioned mid-level voltage. Ensuring that the signal fluctuations do not cause anomalous behavior, such as, for example, erroneous reading of DQ when data is not available, is known to be problematic.

Figure 3:
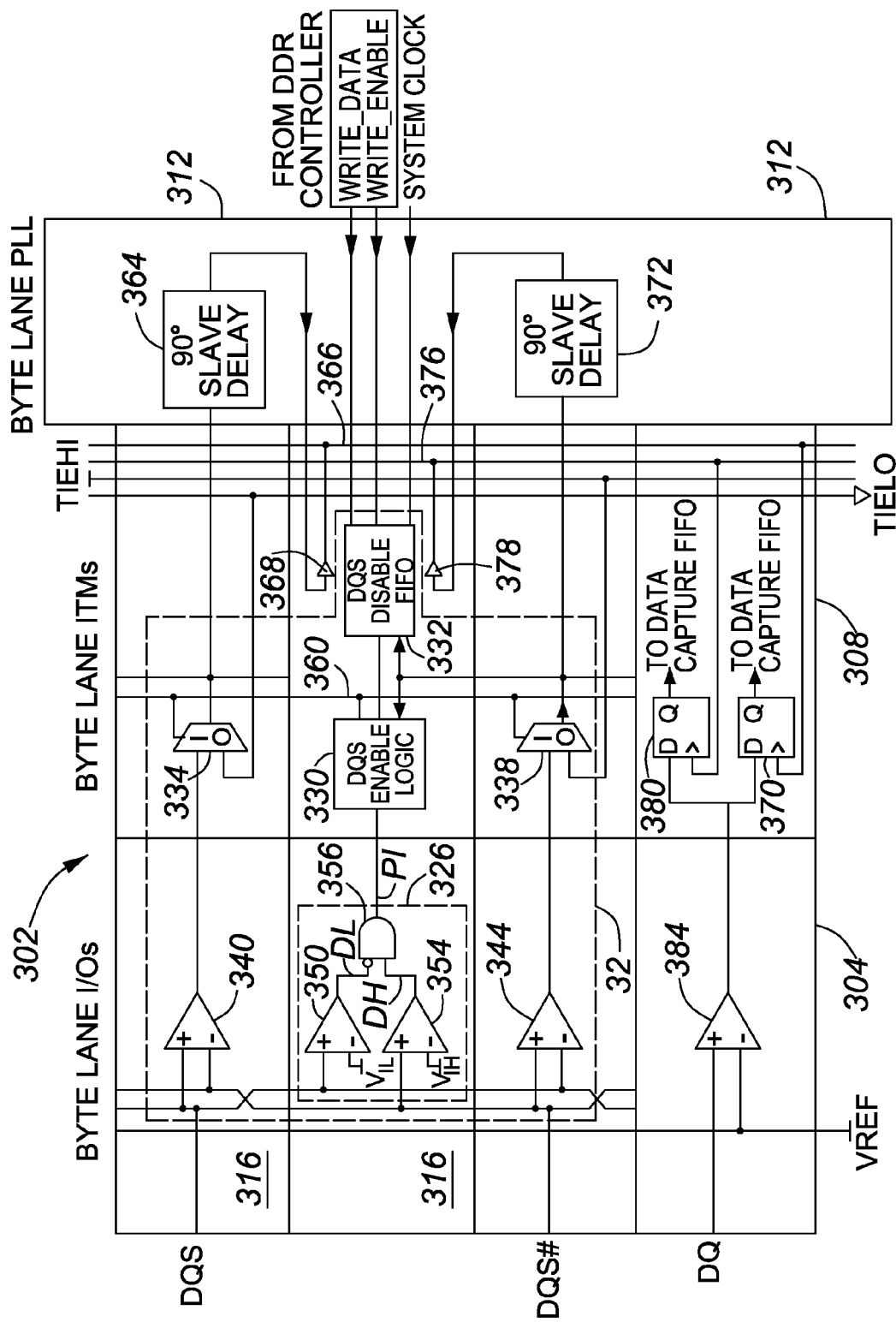
FIG. 3 is a circuit schematic representation of a number of memory controller circuits, including a DQS transition detection circuit in accordance with an example embodiment.

Reference will now be made to FIGS. 1 and 3. FIG. 3 shows a circuit schematic representation of a DQS transition detection circuit in accordance with an example embodiment. In the illustrated example, the DQS transition detection circuit is a DQS enable circuit 32. Also, the illustrated DQS transition detection circuit is situated within the PHY 302 of the memory controller 20; however in some example implementations, the DQS transition detection circuit might be situated somewhere else within the SDRAM device 10, such as within the DDR SDRAM 22, for instance.

The PHY 302 is divided into a number of byte lanes in a manner known to those skilled in the art. In particular, the illustrated PHY 302 is divided into a byte lane 304 for I/Os, a byte lane 308 for Interface Timing Modules (ITMs), and a byte lane 312 for PLL(s). Conveniently, the illustrated byte lanes 304 and 308 are further divided into tileable cells (two of which are labeled 316 in FIG. 3). As will be appreciated by those skilled in the art, the use of tileable cells facilitates the interlacing of power and data signals having regard to inner and outer bond pads, and its use also provides for increased flexibility as compared to if the byte lanes 304 and 308 were not further divided into tileable cells. The illustrated enable circuit 32 falls within six tileable cells 316 (three cells of the byte lane 304 and three cells of the byte lane 308); however in alternative examples the DQS enable circuit may fall within fewer or additional tileable cells. In at least one example, it is convenient for the cells each separately containing comparators 340 and 344 to be two instances of the same cell.

The illustrated enable circuit 32 includes a preamble indication circuit 326, DQS enable logic circuitry 330, DQS disable First In First Out (FIFO) circuitry 332, multiplexing circuitry 334, multiplexing circuitry 338, and the comparators 340 and 344. Input signals to the enable circuit 32 include a DQS signal, a DQS# signal, a write_data signal, a write_enable signal, and a system clock. Output signals from the enable circuit 32 include an output signal of the multiplexing circuitry 334, and an output signal of the multiplexing circuitry 338.

Reference will now be made to the preamble indication circuit 326. The indication circuit 326 includes comparators 350 and 354 and an AND logic gate 356 (with inversion at one of the gate inputs). The non-inverting and inverting inputs of the comparator 350 are electrically connected to, respectively, DQS and a lower threshold $V_{IL}$ of a voltage range. The non-inverting and inverting inputs of the comparator 354 are electrically connected to, respectively, DQS# and an upper threshold $V_{IH}$ of the $V_{IL}$-$V_{IH}$ voltage range. The output of the comparator 350 is electrically connected to the input of the AND logic gate 356 with preceding inversion. The output of the comparator 354 is electrically connected to the other input of the AND logic gate 356. The output of the AND logic gate 356 is electrically connected to the enable logic circuitry 330.

Figure 4:
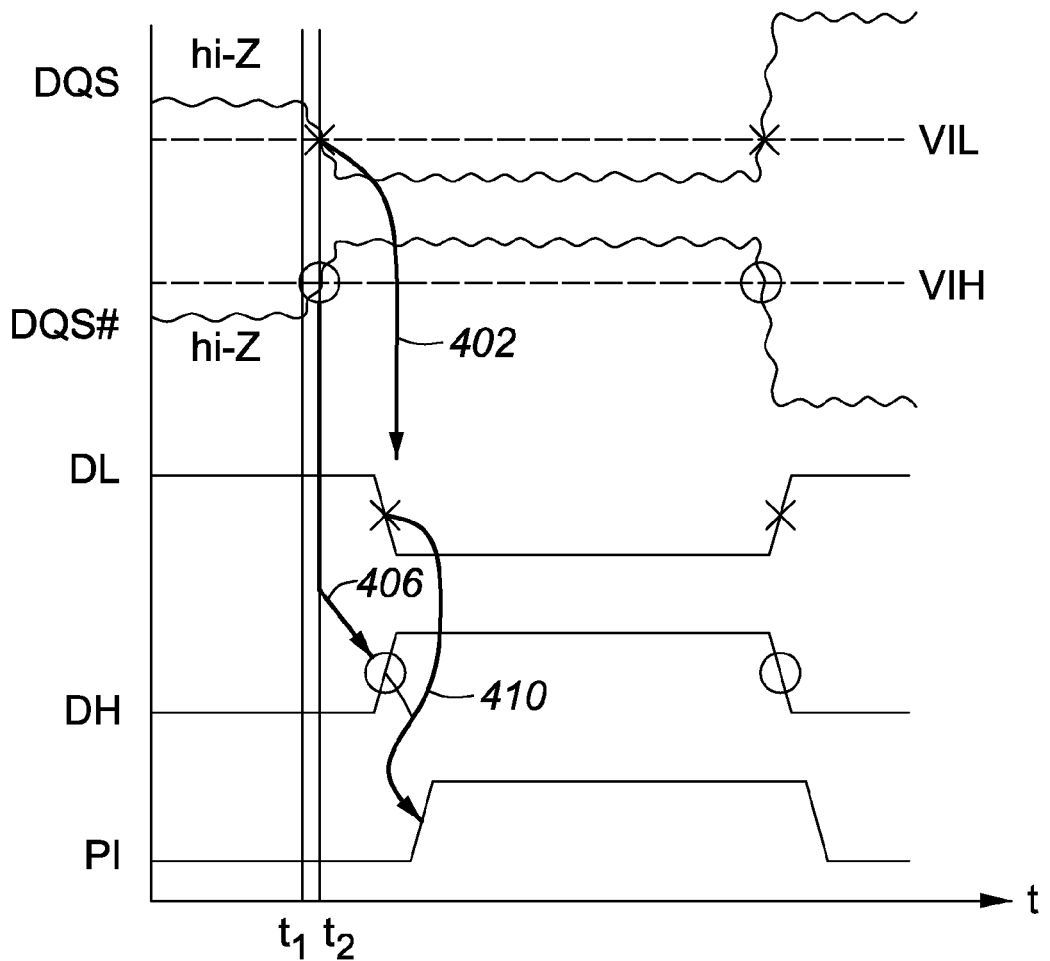
FIG. 4 is a timing diagram illustrating the operation of a preamble indication circuit within the DQS enable circuit of FIG. 3.

The operation of the preamble indication circuit 326 during the DQS preamble period (period T2 in FIG. 2) will now be explained with reference to FIGS. 3 and 4. FIG. 4 is a timing diagram showing the following: DQS and DQS# (noisy in the illustrated example), DL (output signal of the comparator 350), DH (output signal of the comparator 354), and PI (output of the AND logic gate 356).

Now with reference to time $t_1$, which corresponds to a transition moment in time from the high-impedance period to the preamble period, it will be seen that the voltage of DQS begins falling towards logic low, and the voltage of DQS# begins rising towards logic high. As the voltage of DQS begins falling towards logic low, DQS subsequently crosses through voltage $V_{IL}$ (at time $t_2$ in the illustrated example). Thus the DQS transition is detected, and in response output signal DL of the comparator 350 changes from logic high to logic low as indicated by transition arrow 402.

While the voltage of DQS begins falling towards logic low at time $t_1$, the voltage of DQS# begins rising towards logic high at this time. DQS# then crosses through voltage $V_{IH}$ (at time $t_2$ in the illustrated example). Thus the DQS# transition is detected, and in response output signal DH of the comparator 354 changes from logic low to logic high as indicated by transition arrow 406. Thus signals at logic levels necessary for producing logic high on output signal PI (output of the AND logic gate 356) are received at the inputs of the AND logic gate 356. Namely, logic low is received at the input with preceding inversion, and logic high is received at the other input. At logic high, the output signal PI provides indication that the preamble period has occurred as explained below. (It will be understood that example embodiments are not limited to those specific examples where the preamble indication is low-to-high logic level transition.)

In the illustrated example, the output signal PI is received by the DQS enable logic circuitry 330. Output 360 of the enable logic circuitry 330 is electrically connected to the selection inputs of the multiplexing circuitries 334 and 338, and thus a change in the output 360 on the next clock edge, that is brought about by preamble indication received from the preamble indication circuit 326, results in differential DQS–DQS# signals from the comparators 340 and 344 being selectively passed through the multiplexing circuitries 334 and 338 respectively.

In addition to being controlled in part by the output of the preamble indication circuit 326, the enable logic circuitry 330 is, in at least one example, also controlled in part by the output of the disable FIFO circuitry 332, which is in turn controlled in part by input signals 'write_data' and 'write_enable'. 'Write_data' defines the write data bit, and 'write_enable' causes the output buffer to be turned on when the signal is at an active logic level.

With respect to a first differential DQS signal passed through the multiplexing circuitry 334, delay circuit 364 (a DLL, for example) phase shifts the first differential DQS for proper alignment with DQ. In the illustrated example, the delay circuit 364 includes a slave DLL. In this regard, it will be understood that, for any slave DLL in a memory controller, there will exist a corresponding master DLL also within that memory controller. The master DLL derives a 0° clock which is phase locked to the main clock, and also 90°, 180°, and 270° phases. The slave DLL creates a constant 90° phase shift.

Phase shifted by the delay circuit 364, the first delayed differential DQS is made available along an electrical path 366, with a driver 368 facilitating this as understood by those skilled in the art. The clock input of a latch 370 (a D flip-flop in the illustrated example) is electrically connected to the path 366 to receive the delayed differential DQS signal.

With respect to a second differential DQS signal passed through the multiplexing circuitry 338, delay circuit 372 (a DLL, for example) phase shifts the second differential DQS for proper alignment with DQ. The second delayed differential DQS is then made available along an electrical path 376, with a driver 378 facilitating this as understood by those skilled in the art. The clock input of a latch 380 (a D flip-flop in the illustrated example) is electrically connected to the path 376 to receive the delayed differential DQS signal.

In the illustrated example, both the latches 380 and 370 receive DQ at their respective inputs as facilitated by driver 384 in a manner understood by those skilled in the art. Each next data of DQ is provided to a data capture FIFO in an alternating manner from either the latch 370 or 380, depending on which latch has its clock input brought active at that time.

Figure 5:
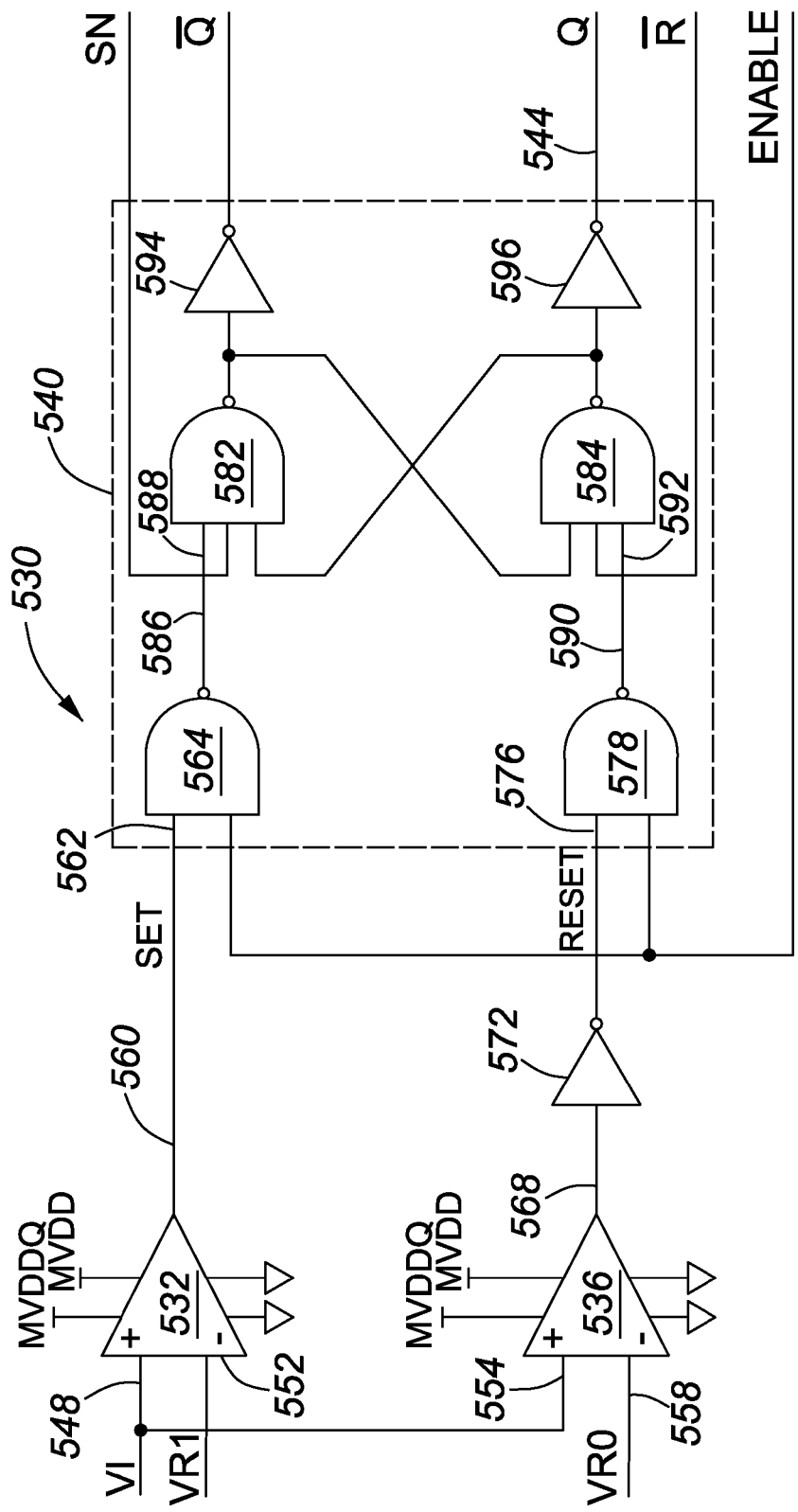
FIG. 5 is a circuit schematic representation of a DQS transition detection circuit in accordance with an alternative example embodiment.

FIG. 5 is a circuit schematic representation of a DQS transition detection circuit 530 in accordance with an alternative example embodiment. The illustrated circuit 530 is similar to a Schmidt Trigger with respect to its precision hysteresis characteristics, but unlike a Schmidt Trigger, one skilled in the art should understand that the circuit shown in FIG. 5 has precise trigger points for hysteresis.

The illustrated circuit 530 includes two comparators 532 and 536, an R-S latch 540 and a number of inverters. In operation, the circuit 530 corrects a signal VI (DQS signal) that is applied at inputs of the comparators 532 and 536, outputting a corrected signal at circuit output 544. It will be understood that the signal VI could be corrupted or distorted to at least some degree. For example, the signal VI may be noisy. Also, one skilled in the art will appreciate that the illustrated R-S latch 540 is an enable latch (level triggered); however it should be understood that in a number of contemplated embodiments any suitable storage circuitry that functions in a manner similar to an R-S latch could be employed.

With respect to the comparators 532 and 536, in at least some examples these are specialized comparators designed to be used as chip input buffers. In the illustrated circuit 530, non-inverting input 548 of the comparator 532 is coupled to the signal VI, and inverting input 552 is coupled to a reference voltage VR1 (high threshold of a hysteresis voltage). With respect to the comparator 536, non-inverting input 554 is coupled to the signal VI and inverting input 558 is coupled to a reference voltage VR0 (low threshold of the hysteresis voltage). Both the illustrated comparators 532 and 536 are provided with voltage sources MVDD and MVDDQ, the voltage source MVDD being intermediate MVDDQ and ground potential. In some examples, MVDDQ is the I/O signaling voltage, which is a selected one of 2.5V, 1.8V and 1.5V, and MVDD is the chip core voltage, which is a selected one of 1.0V and 1.2V.

Output 560 of the comparator 532 is coupled to a SET input of the R-S latch 540, which is input 562 of NAND gate 564 in the illustrated example embodiment. With respect to output 568 of the other comparator in the circuit 530, it is coupled to the input of inverter 572. The output of the inverter 572 is coupled to a RESET input of the R-S latch 540, which is input 576 of NAND gate 578 in the illustrated example embodiment. Two additional NAND gates within the R-S latch 540 are cross-coupled NAND gates 582 and 584. Output 586 of the NAND gate 564 is coupled to input 588 of the NAND gate 582, while output 590 of the NAND gate 578 is coupled to input 592 of the NAND gate 584. The illustrated R-S latch 540 also includes inverters 594 and 596 coupled to the outputs of the NAND gates 582 and 584 respectively. These inverters help prevent a glitch at the NAND gate outputs that might cause erroneous flipping. The inverters 594 and 596 also provide drive.

Still with reference to FIG. 5, as long as the signal VI applied at the input 548 of the comparator 532 is above the high threshold reference voltage VR1 applied at the input 552, the state at the output 560 will be logic '1'. In the case however where the signal VI applied at the input 548 of the comparator 532 falls below the high threshold reference voltage VR1, the state at the output 560 will transition from logic '1' to logic '0'. As for the other comparator, as long as the signal VI applied at the input 554 of the comparator 536 is below the low threshold reference voltage VR0 applied at the input 558, the state at the output 568 will be logic '0'. In the case however where the signal VI applied at the input 554 of the comparator 536 rises above the low threshold reference voltage VR0, the state at the output 568 will transition from logic '0' to logic '1'.

Based on the above, whether the illustrated R-S latch 540 is 'set' or 'reset' will depend upon where the voltage of the signal VI falls relative to the reference voltages VR1 and VR0. If the voltage of the signal VI is above the reference voltage VR1, logic '1' and logic '0' will be applied to the SET and RESET inputs respectively. As will be appreciated by those skilled in the art, this condition 'sets' the R-S latch 540 (i.e. causes logic '1' to appear at the output 544). If the voltage of the signal VI is in between the reference voltage VR1 and the reference voltage VR0, logic '0' will be applied to both the SET and RESET inputs. As will be appreciated by those skilled in the art, this condition is the 'hold' condition for the R-S latch 540 (i.e. the state at the output 544 remains the same). Finally, if the voltage of the signal VI is below the reference voltage VR0, logic '0' and logic '1' will be applied to the SET and RESET inputs respectively. It will be understood that this condition 'resets' the R-S latch 540 (i.e. causes logic '0' to appear at the output 544). With respect to an ENABLE signal received at an input of each of the NAND gates 564 and 578, the R-S latch 540 passes through latch inputs signals when this signal is logic low, and holds state when the signal is logic high.

The operation of the DQS transition detection circuit 530 with a noisy DQS signal applied as VI at the non-inverting input terminals of the comparators 532 and 536 will now be explained with reference to FIG. 6. As can be seen in the timing diagram, at instances in time such as $t_y$, for example, the logic level at the SET input of the R-S latch 540 goes to logic high when VI rises above the high threshold reference voltage VR1. Additionally, at instances in time such as $t_x$, for example, the logic level at the RESET input of the R-S latch 540 goes to logic high when VI falls below the low threshold reference voltage VR0.

It will be seen that at times $t_i$ and $t_v$, VI momentarily jumps above (sinks below) the reference voltage causing a corresponding momentary logic high-to-low transition in the signal at the RESET input (SET input). These short lived transitions do not produce an output value change in the R-S latch 540. In particular, the momentary logic high-to-low transition in the signal at the RESET input following the threshold crossing at $t_i$ does not result in a change in logic levels of the illustrated output signal Q because, as will be appreciated by those skilled in the art, logic low at both inputs of an R-S latch means that $Q(t+\Delta)=Q(t)$ (i.e. what is frequently referred to as the 'hold' state). Similarly (and for essentially the same reason) the momentary logic high-to-low transition in the signal at the SET input following the threshold crossing at $t_v$ does not result in a change in logic levels of the illustrated output signal Q.

Figure 6:
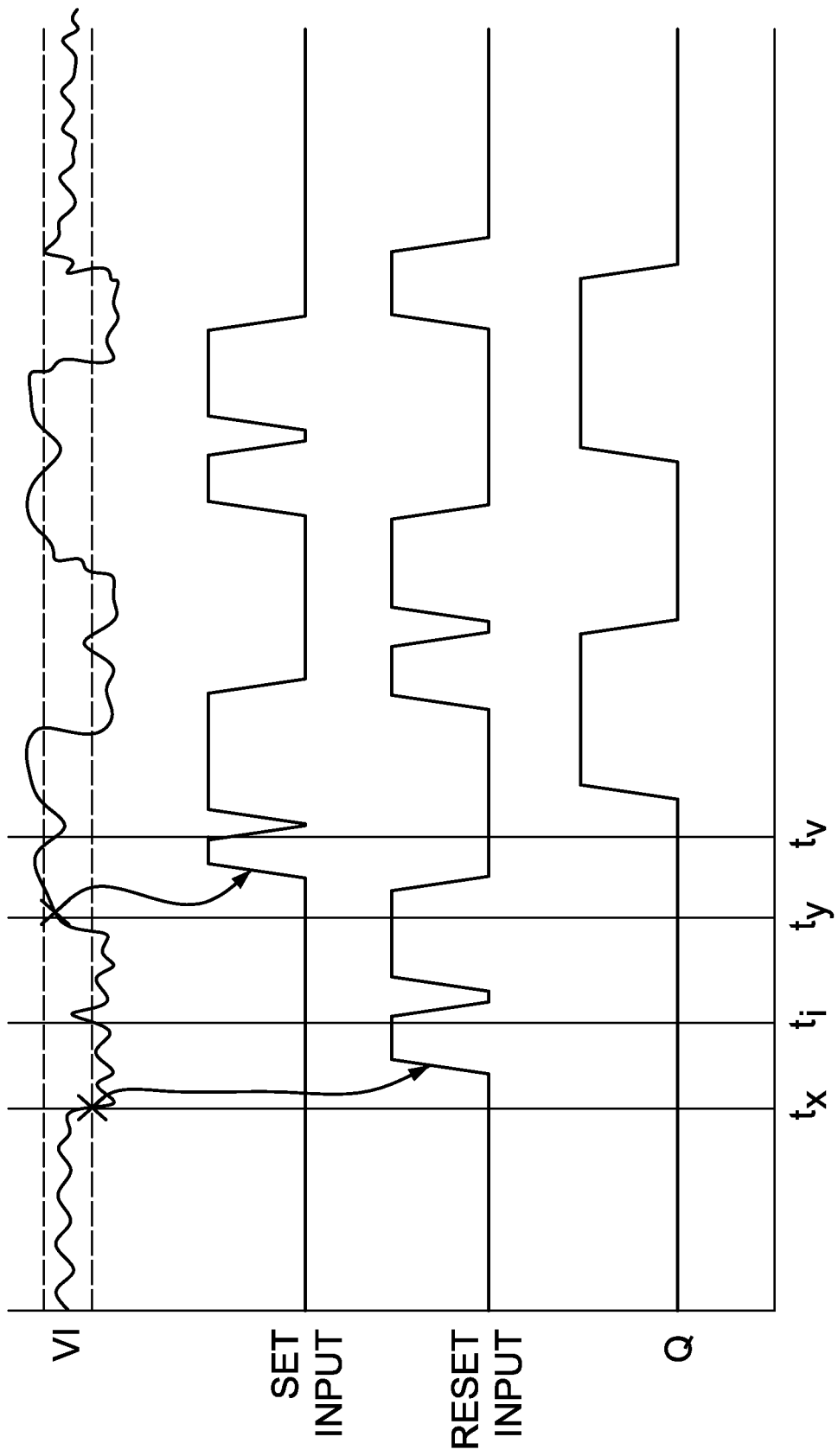
FIG. 6 is a timing diagram illustrating the operation of the DQS transition detection circuit of FIG. 5.

With reference to both FIGS. 2 and 6, the output signal Q should generally be an incorrupted strobe signal in spite of noise in VI so long as: i) during periods T2, T3 and T4, the noisy DQS signal does not anomalously jump/sink through the entire hysteresis voltage range; and ii) during the indeterminate periods (T1 and T5) the noisy DQS signal stays within the hysteresis voltage range. It is theorized that, in certain memory systems, the DQS transition detection circuit 530 may be inadequate because the probability that the noisy DQS signal will not stay within the hysteresis voltage range during certain indeterminate periods is simply too high. For example, it is not uncommon for a ringing (such as is illustrated in FIG. 6) to occur at a point in time right after completion of the postamble (i.e. at the beginning of T5). As a result of such ringing, DQS can shoot up to a voltage relatively close to logic high, and perhaps above VR1 in a manner so as to cause anomalous behavior of the type aforementioned in this disclosure.

With respect to the illustrated example, it will be seen that the preamble and postamble present in the input signal VI are missing in the output signal Q. It should be understood however that this is not characteristic of all examples of incorrupted strobe signals produced by contemplated circuit embodiments having similarity to the DQS transition detection circuit 530. For example, generation of an output strobe that includes a preamble could be accomplished with the addition of only some relatively non-complex circuitry to the DQS transition detection circuit 530.

With reference again to FIG. 1, it should be noted that a single memory controller 20 and a single DDR SDRAM 22 have been shown for convenience of illustration only, and it will be understood that example embodiments are in no way limited to SDRAM devices that consist of only a single controller providing commands to a single memory chip. In some examples the SDRAM device 10 will include a single memory controller 20 and multiple DDR SDRAMs 22. In other examples the SDRAM device 10 will include multiple memory controllers 20 and multiple DDR SDRAMs 22.

Although example embodiments have been described with reference to DDR SDRAM, it will be understood that at least some example embodiments can be employed in other memory devices that might not be categorized as DDR SDRAM. For example, at least some example embodiments can be employed in Quad Data Rate SDRAM (QDR SDRAM) and Extreme Data Rate SDRAM (XDR SDRAM).

Various circuits and circuit components described in the preceding detailed description of example embodiments can be considered to be of a type performing known operations on electronic signals. Those skilled in the art will have knowledge of alternative circuits or circuit components which are recognized as equivalent because they provide the same operations on the signals.

Certain adaptations and modifications of the described embodiments can be made. Therefore, the above discussed embodiments are considered to be illustrative and not restrictive.

What is claimed is:

1. A method for preamble detection within a microelectronics system, the method comprising:
    receiving a clock signal of the type in which a series of regular pulses in voltage level of said clock signal are preceded by a preamble period having a beginning and an end, a transition in said clock signal from an indeterminate logic level to a selected one of a high logic level and a low logic level occurring at said beginning of the preamble period;
    receiving a complement of said clock signal, a transition in said complement of the clock signal from said indeterminate logic level to the other of the logic levels occurring at said beginning of the preamble period;
    generating indication that said beginning of the preamble period has occurred by:
        i) detecting said transition in the clock signal based on when the voltage level of the clock signal crosses through a first threshold of a voltage range; and
        ii) detecting said transition in said complement of the clock signal based on when the voltage level of said complement of the clock signal crosses through a second threshold of said voltage range.

2. The method as claimed in claim 1, wherein said clock signal is a data strobe clock (DQS) signal and said complement of the clock signal is a complement of said DQS signal.

3. The method as claimed in claim 2, wherein the selected one of the logic levels is said low logic level, and the other of the logic levels is said high logic level.

4. The method as claimed in claim 1, wherein the detecting said transition in the clock signal is carried out by a comparator having one of its inputs receiving a reference voltage at said first threshold.

5. The method as claimed in claim 4, wherein said one of the inputs is an inverting input, and said first threshold is higher than said second threshold.

6. The method as claimed in claim 1, wherein the detecting said transition in said complement of the clock signal is carried out by a comparator having one of its inputs receiving a reference voltage at second threshold.

7. The method as claimed in claim 6, wherein said one of the inputs is an inverting input, and said first threshold is higher than said second threshold.

* * * * *